(12) United States Patent
Edelman

(10) Patent No.: US 10,401,458 B2
(45) Date of Patent: Sep. 3, 2019

(54) SYSTEMS AND METHODS FOR MULTI-ECHO, BACKGROUND SUPPRESSED MAGNETIC RESONANCE ANGIOGRAPHY

(71) Applicant: NORTHSHORE UNIVERSITY HEALTH SYSTEM, Evanston, IL (US)

(72) Inventor: Robert R. Edelman, Highland Park, IL (US)

(73) Assignee: NORTHSHORE UNIVERSITY HEALTH SYSTEM, Evanston, IL (US)

( * ) Notice: Subject to any disclaimer, the term of this patent is extended or adjusted under 35 U.S.C. 154(b) by 156 days.

(21) Appl. No.: 15/708,824

(22) Filed: Sep. 19, 2017

(65) Prior Publication Data
US 2018/0081017 A1   Mar. 22, 2018

Related U.S. Application Data

(60) Provisional application No. 62/396,623, filed on Sep. 19, 2016.

(51) Int. Cl.
| G01R 33/563 | (2006.01) |
| G01R 33/48 | (2006.01) |
| G01R 33/56 | (2006.01) |
| G01R 33/483 | (2006.01) |

(52) U.S. Cl.
CPC ...... *G01R 33/5635* (2013.01); *G01R 33/4824* (2013.01); *G01R 33/4838* (2013.01); *G01R 33/5608* (2013.01)

(58) Field of Classification Search
CPC ............ G01R 33/5635; G01R 33/4824; G01R 33/4838; G01R 33/5608
See application file for complete search history.

(56) References Cited

U.S. PATENT DOCUMENTS

| 2010/0245360 A1* | 9/2010 | Song | A61B 5/02007 345/441 |
| 2010/0277172 A1* | 11/2010 | Takizawa | G01R 33/5616 324/309 |
| 2011/0166436 A1* | 7/2011 | Edelman | G01R 33/5614 600/410 |
| 2015/0137811 A1* | 5/2015 | Muftuler | G01R 33/34 324/309 |
| 2015/0371372 A1* | 12/2015 | Athavale | G06T 5/002 382/131 |
| 2016/0327623 A1* | 11/2016 | Nakai | G01R 33/4828 |

* cited by examiner

*Primary Examiner* — Rodney A Bonnette
(74) *Attorney, Agent, or Firm* — Quarles & Brady LLP

(57) ABSTRACT

Described here are systems and methods for generating projection angiograms with enhanced background suppression. Images are acquired with an MRI system at different echo times (e.g., a first and second echo time) in a given repetition time period. A mask image is generated based on the images, such as by computing a difference between the images. The mask image is scaled by different scale factors computed based on the different images. The scale factors are computed based on a ratio of a selected tissue signal (e.g., fat signal) in each image and the mask image. The scaled mask images are subtracted from the respective images and a projection angiograms are produced from these processed images.

19 Claims, 10 Drawing Sheets

SYSTEMS AND METHODS FOR MULTI-ECHO, BACKGROUND SUPPRESSED MAGNETIC RESONANCE ANGIOGRAPHY

CROSS-REFERENCE TO RELATED APPLICATIONS

This application claims the benefit of U.S. Provisional Patent Application Ser. No. 62/396,623, filed on Sep. 19, 2016, and entitled "SYSTEMS AND METHODS FOR MULTI-ECHO, BACKGROUND SUPPRESSED MRA," which is herein incorporated by reference in its entirety.

STATEMENT REGARDING FEDERALLY SPONSORED RESEARCH

This invention was made with government support under HL130093 awarded by the National Institutes of Health. The government has certain rights in the invention.

BACKGROUND

The field of the disclosure is systems and methods for magnetic resonance imaging ("MRI"). More particularly, the disclosure relates to systems and methods for multi-echo background-suppressed magnetic resonance angiography (MRA).

Peripheral vascular disease (PVD) has an age-adjusted prevalence of 12% in the United States, causes significant morbidity, and is often associated with excess cardiovascular mortality. Contrast-enhanced (CE) magnetic resonance angiography (MRA) often substitutes for the more invasive "gold standard" procedure of digital subtraction angiography. Given the frequency of renal functional impairment in patients with PVD and concerns about nephrogenic systemic fibrosis, there is growing interest in non-contrast-enhanced MRA.

Quiescent-interval slice-selective (QISS) MRA has is an efficient and accurate non-contrast technique for the evaluation of peripheral arterial disease. In QISS MRA, the MRI system acquires data using a modified single shot two-dimensional balanced steady-state free precession (bSSFP) pulse sequence. Unlike subtractive non-contrast-enhanced three-dimensional MRA methods, the imaging parameters for QISS MRA require minimal if any tailoring for individual patients. However, compared with CE-MRA, the bSSFP readout used for QISS is more sensitive to susceptibility effects.

For example, in certain circumstances such as imaging near a metallic hip prosthesis or at 3 Tesla near an air-containing bowel loop, the image quality may be degraded by susceptibility artifacts due to the use of a bSSFP readout. A high bandwidth and short TE may reduce artifacts at the expense of worsening small vessel conspicuity on projection images.

It would therefore be desirable to provide MRI systems and methods with enhanced background suppression to overcome the above limitations.

SUMMARY OF THE DISCLOSURE

The present disclosure overcomes the aforementioned drawbacks by providing a method for producing an image of a subject using a magnetic resonance imaging ("MRI") system, in which data is acquired from a subject by directing the MRI system to perform a pulse sequence that forms echoes at least at two different echo times. The MRI system acquires first echo image data at a first echo time and second echo image data at a second echo time. A first image is reconstructed from the first echo image data and a second image is reconstructed from the second echo image data. A mask image is generated using the first and second image. A first scale factor (SF1) is computed by calculating a first ratio of a selected tissue signal in the first image and the mask image, and a first scaled mask image is generated by multiplying the mask image by SF1. A second scale factor (SF2) is computed by calculating a second ratio of the selected tissue signal in the second image and the mask image, and a second scaled mask image is generated by multiplying the mask image by SF2. A first processed image is generated by subtracting the first scaled mask image from the first image, and a second processed image is generated by subtracting the second scaled mask image from the second image. A projection angiogram is then generated from the processed images.

The foregoing and other aspects and advantages of the disclosure will appear from the following description. In the description, reference is made to the accompanying drawings that form a part hereof, and in which there is shown by way of illustration a preferred embodiment of the disclosure. Such embodiment does not necessarily represent the full scope of the disclosure, however, and reference is made therefore to the claims and herein for interpreting the scope of the disclosure.

DETAILED DESCRIPTION

Described here are systems and methods for magnetic resonance angiography with enhanced suppression of background signals. First and second echo image data are acquired using a multi-echo pulse sequence having a first and second echo time, from which first and second images are reconstructed. A mask image is generated by subtracting the first and second image. A first scale factor is calculated as a ratio of fat signal in the first image and the mask image, and a first scaled mask image is generated by multiplying the mask image by the first scale factor. A second scale factor is calculated as a ratio of fat signal in the second image and the mask image, and a second scaled mask image is generated by multiplying the mask image by the second scale factor. A first processed image is generated by subtracting the first scaled mask image from the first image, and a second processed image is generated by subtracting the second scaled mask image from the second image. A projection angiogram is then generated from the processed images.

Figure 1:
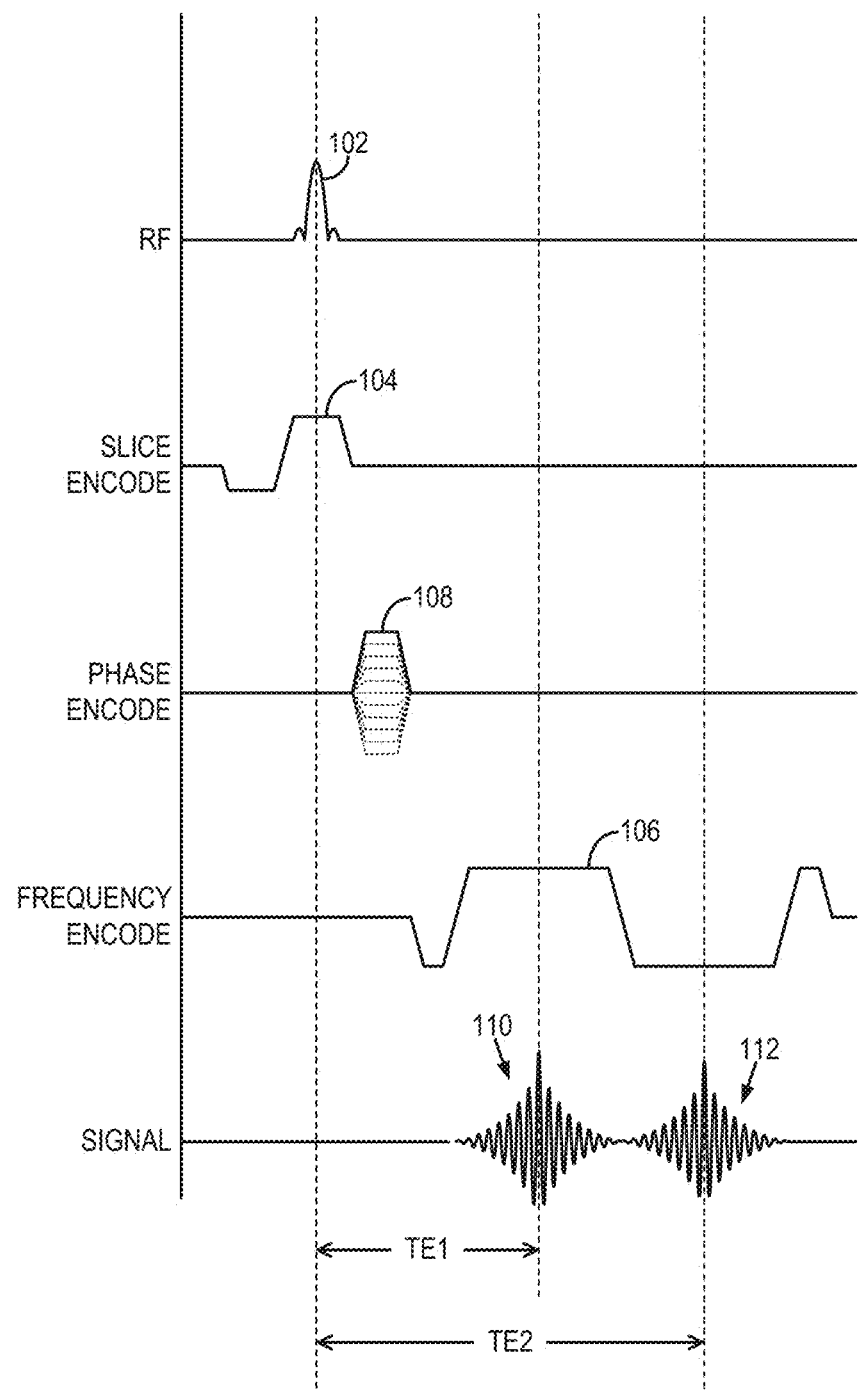
FIG. 1 is a graphic illustration of an example pulse sequence that can be used by a magnetic resonance imaging ("MRI") system to acquire multi-echo data in accordance with the present disclosure.

FIG. 1 is a graphic illustration of one example of a pulse sequence that can be implemented to acquire multi-echo data in accordance with the present disclosure. In FIG. 1, the pulse sequence includes an RF pulse 102 that is generated while the MRI system applies the slice selection gradient 104. The pulse sequence also includes a readout gradient 106 and a phase encoding gradient 108. In this example pulse sequence, two gradient echoes 110 and 112 with different echo time TE1 and TE2, respectively, are formed and sampled. Other gradients or RF pulses may be applied by the MRI system if needed or desired. As one example, in some implementations a multiband RF pulse can be used to simultaneously excite spins in more than one slice. Simultaneous multislice acquisitions and reconstruction techniques can then be used to reconstruct images from multiple different slice locations from data that were simultaneously acquired.

In one example, the MRI system implements a dual-echo, dual-bandwidth QISS FLASH sequence that allows for enhanced background suppression. As one example, this pulse sequence can use the following imaging parameters: 40 slices with thickness=3 mm; in-plane resolution 1.1 mm; TE1=1.7 ms with bandwidth 930 Hz/pixel; TE2=3.9 ms with bandwidth 395 Hz/pixel; bipolar gradients; no fat suppression; flip angle=30 degrees; 2-4 shots; in-plane FOCI pulse. Image sets for both echoes can be reconstructed and a mask image can be created by taking the absolute difference of the two image sets. The mask image can be scaled so that fat signal matched that in the first echo image, and then subtracted from the first echo image. The same process may be used for the second echo image, also with mask scaling. The MRI system may then create maximum intensity projection ("MIP") images from the difference images.

Figure 2:
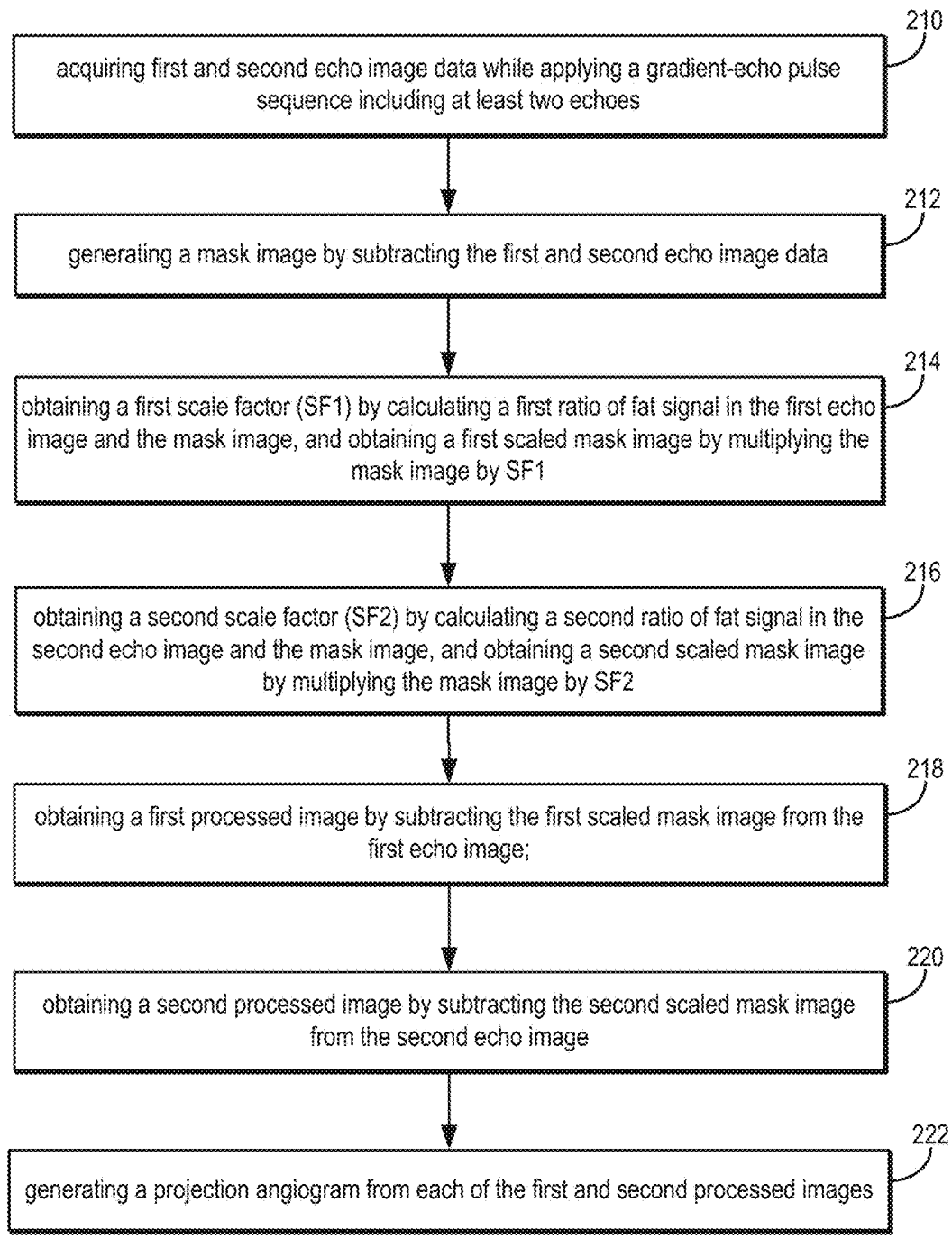
FIG. 2 is an example flow chart setting forth the steps of a method in accordance with the present disclosure.

FIG. 2 is an example flow chart setting forth the steps of a method in accordance with the present disclosure. In step 210, the MRI system acquires first echo image data at a first echo time and second echo image data at a second echo time within the same repetition time period while controlling the RF system and the plurality of gradient coils to apply a gradient-echo pulse sequence that forms echoes at least at the first and second echo times. Here, the MRI system may acquire the first and second echo image data using different readout bandwidths. Accelerated imaging techniques can also be used to accelerate data acquisition. In addition to the simultaneous multislice technique mentioned above, parallel imaging techniques may also be implemented to accelerate in-plane k-space sample. For instance, undersampling can be used together with a parallel imaging reconstruction technique, such as SENSE or GRAPPA.

In one instance, the first echo image data are acquired with a higher readout bandwidth than the readout bandwidth used to acquire the second echo image data. In addition, the first echo image data are acquired at a short echo time (TE).

As one example, the MRI system may acquire the first echo image data using a high readout bandwidth greater than 400 Hz/pixel and a short TE less than 2 milliseconds. The short TE used for the first echo minimizes susceptibility artifacts and maximizes the signal from adipose and muscle tissues, but the high bandwidth provides a smaller signal-to-noise ratio ("SNR") than the lower bandwidth, second echo readout. Compared with the first echo image data, the second echo image data are more sensitive to susceptibility artifacts and there is less signal from fat and muscle. Further, to minimize loss of signal from flowing blood between the first and second echoes, gating to a diastolic phase of the cardiac cycle or flow compensation may be applied.

In step 212, a mask image can be generated by subtracting images reconstructed from the first and second echo image data (i.e., a first image and a second image, respectively). For instance, a mask image representing the absolute signal difference of the first and second echo images can be calculated. The mask image shows substantial signal from fat, muscle, ghost artifacts, and susceptibility artifacts, while containing negligible signal from flowing blood. Because susceptibility artifacts have a differing spatial extent and intensity for each echo, the mask image may show a bright halo around each metal implant and facilitate their identification and localization. In some other implementations, the mask image can be generated based on a standard deviation calculated from the first and second images. In such examples, it may be beneficial to acquire additional data from different echoes at different echo times, such that additional images are reconstructed and used to compute the standard deviation.

In step 214, a first scale factor ("SF1") is computed by calculating a first ratio of fat signal in the first echo image and the mask image, and a first scaled mask image is generated by multiplying the mask image by SF1. Here, SF1 is calculated as the ratio of the fat signal in the first echo image and the mask image. Multiplication of the mask image by SF1 results in a first scaled mask image.

In step 216, a second scale factor ("SF2") is computed by calculating a second ratio of fat signal in the second echo image and the mask image, and a second scaled mask image is generated by multiplying the mask image by SF2. Here, SF2 is calculated as the ratio of the fat signal in the second echo image and the mask image. Multiplication of the mask image by SF2 results in a second scaled mask image.

In step 218, a first processed image is generated by subtracting the first scaled mask image from the first echo image. In step 220, a second processed image is generated by subtracting the second scaled mask image from the second echo image. Accordingly, the first echo image is processed by subtracting the first scaled mask image, while the second echo image is processed by subtracting the second scaled mask image. In the processed first and second echo images, signal from flowing blood is only slightly diminished, whereas signals from adipose and muscle tissues are markedly reduced. Moreover, the conspicuity of motion-related ghost artifacts is greatly reduced as well.

In step 222, a projection angiogram is generated from each of the first and second processed images. For example, the processed first and second echo images may be separately reconstructed into projective angiograms using a maximum intensity projection ("MIP") algorithm. Because of the suppression of background signals from adipose and muscle tissue, the display of the vasculature in the projection images is greatly improved.

Additional maps or images can also be generated based on the first echo image data and the second echo image data.

For instance, relaxation parameter maps, such as T2* maps, can be generated. As another example, susceptibility maps can be generated. Together with the projection angiograms generated using the methods described in the present disclosure, these additional maps can provide additional diagnostic information to a clinician.

As described below, the methods described in the present disclosure can provide several advantages.

First, time-of-flight MR angiograms require a high flip angle RF excitation in order to suppress the fat signal. An unfortunate consequence of a larger flip angle, however, is saturation of slow flow and horizontal vessel segments, which can falsely cause arteries to appear narrow or occluded. With the system and methods described in this disclosure, the need for background suppression is decoupled from the choice of flip angle. Consequently, signal from adipose tissue can be suppressed even when using a reduced flip angle, thereby resulting in fewer flow-related artifacts and providing better fidelity to the vascular anatomy.

Second, in contrast-enhanced MRA, subtraction of a separately-acquired pre-contrast mask image from a post-contrast image is routinely used in order to suppress the signal from adipose tissue. The separate collection of mask image data increases study time. Moreover, because the mask data is acquired before the contrast-enhanced data, any patient motion causes misregistration artifacts. With the systems and methods described in the present disclosure, these drawbacks do not exist because there is no increase in study time and because there is very little risk of image mis-registration.

Third, for non-contrast-enhanced MRA techniques such as time-of-flight or QISS (quiescent-interval slice-selective), a low readout bandwidth is often used in order to improve SNR. However, the use of a low readout bandwidth and correspondingly long TE increases the sensitivity to susceptibility artifacts from air-containing structures such as the paranasal sinuses, bowel loops as well as metal implants. Susceptibility artifacts can be substantially overcome by acquiring the angiographic data using a short TE and high readout bandwidth. However, a drawback of using this approach is that fat appears bright and will obscure small vessels in the projection image. Subtraction of a scaled mask image as described in the present disclosure effectively suppresses fat signal and thereby maximizes the conspicuity of the blood vessels in the projection angiograms.

Finally, the ability to readily identify metal implants (such as a surgical clip or vascular occluder) in the mask image is helpful in determining whether signal voids in the MRA are caused by susceptibility artifact related to an implant versus vascular stenosis or occlusion.

Figure 3A:
FIG. 3A shows an unprocessed MRA image without fat saturation using a dual-echo QISS FLASH sequence.

FIG. 3A shows an unprocessed MRA image without fat saturation using a dual-echo QISS FLASH sequence. Here, small vessel detail was obscured in the unprocessed first echo images due to the high signal intensity of adipose tissue and fat-containing bone marrow.

Figure 3B:
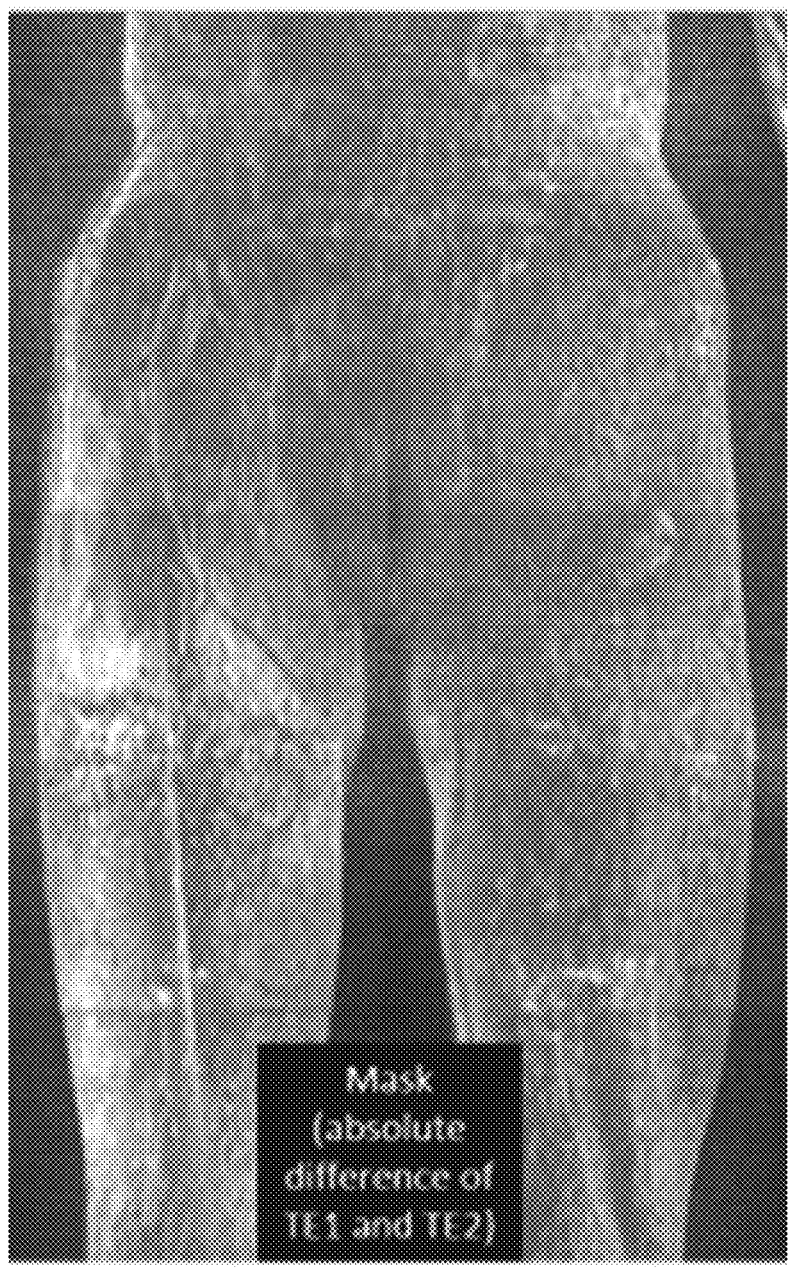
FIG. 3B shows a mask image using the absolute difference of the first echo and the second echo.

FIG. 3B shows a mask image using the absolute difference of the first echo and the second echo. The absolute difference mask image shows high fat signal and moderate muscle signal, with negligible signal from blood vessels. Of additional note, regions of altered magnetic susceptibility manifested in the mask image as distinctive bright regions.

Figure 3C:
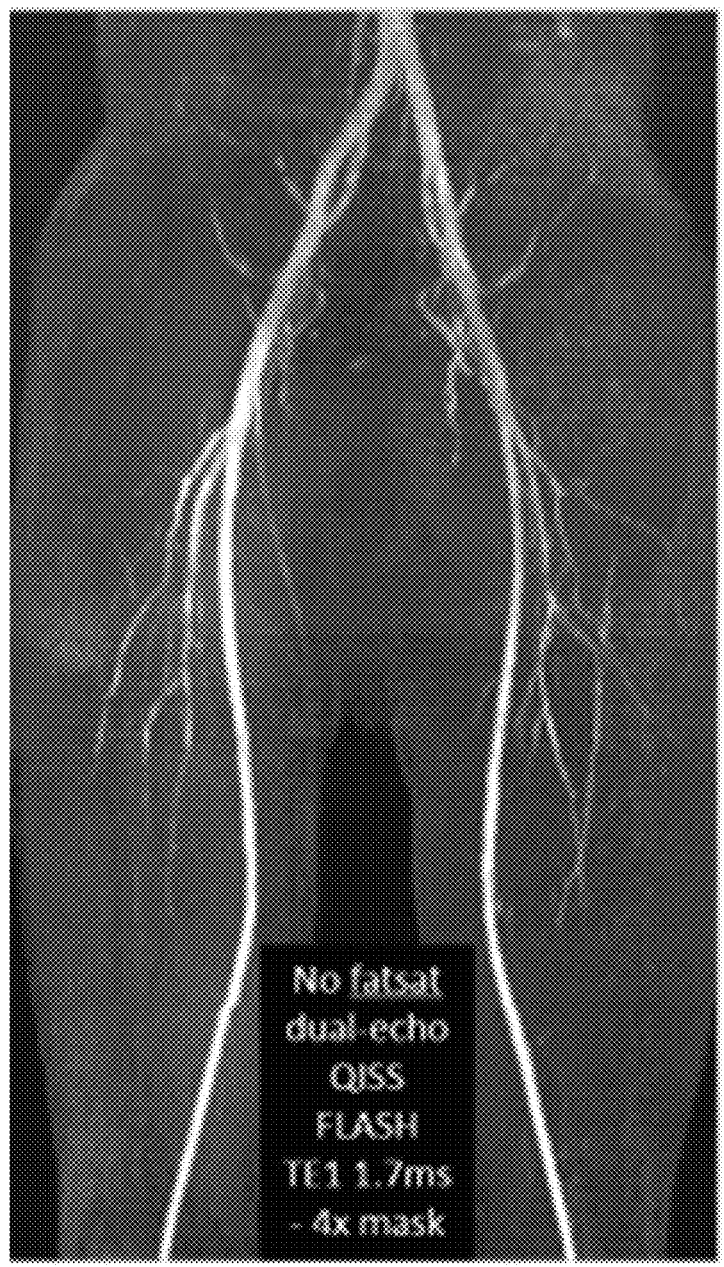
FIG. 3C shows a processed MRA image without fat saturation using a dual-echo QISS FLASH sequence.

FIG. 3C shows a processed MRA image without fat saturation using a dual-echo QISS FLASH sequence. After processing, the background signal was greatly reduced (particularly with the first echo), resulting in improved small vessel detail in the projected difference images.

Figure 4A:
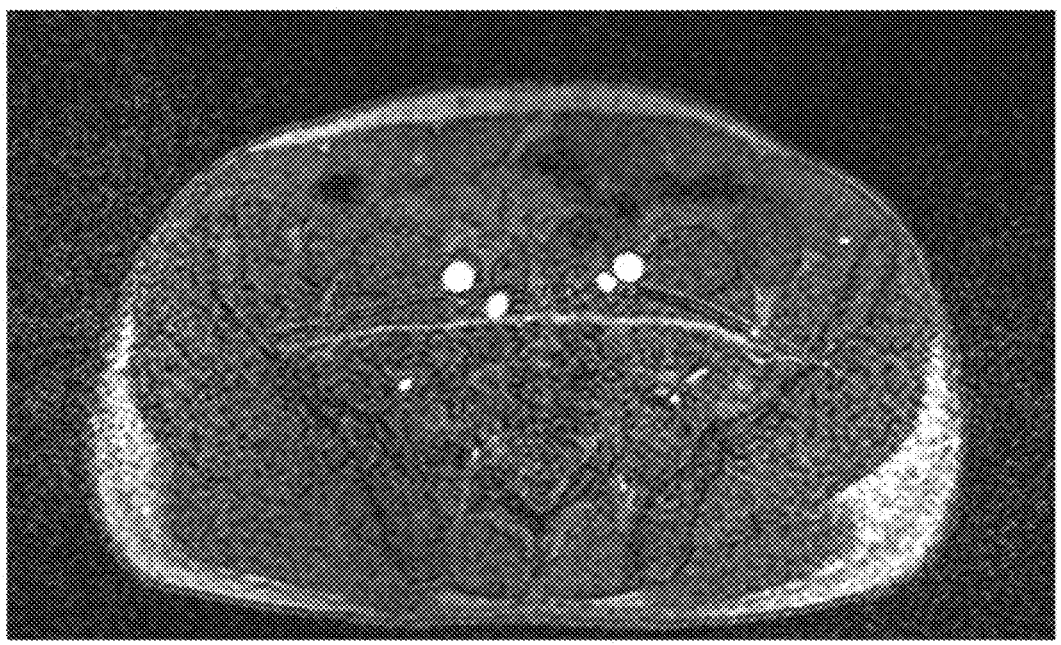
FIG. 4A shows an unprocessed MRA image without fat saturation using a dual-echo QISS FLASH sequence.
Figure 4B:
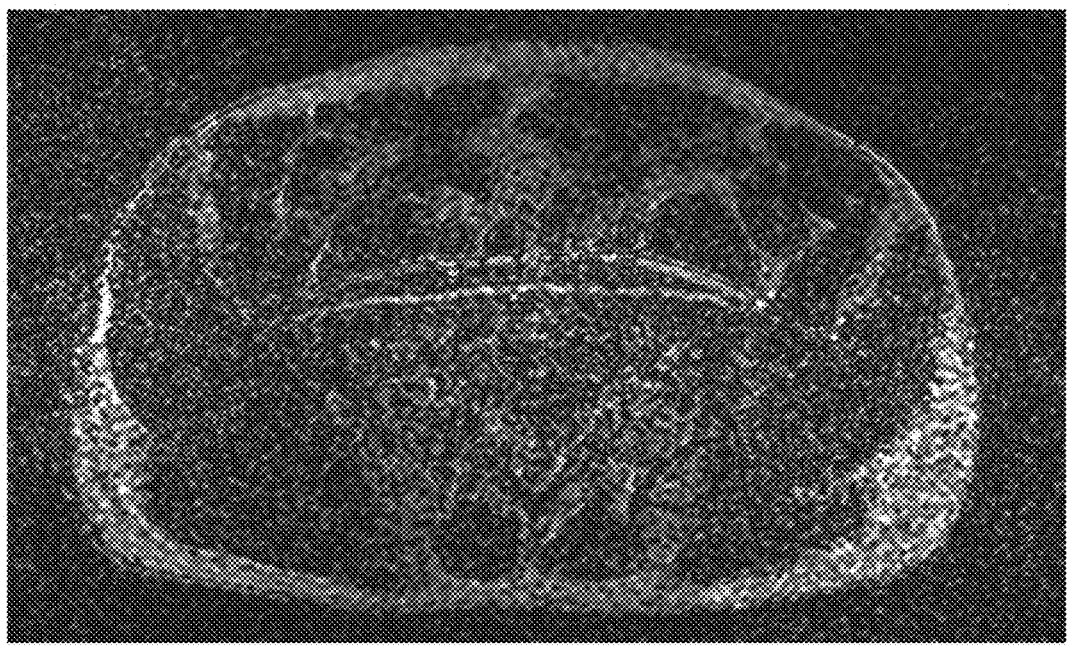
FIG. 4B shows a mask image using the absolute difference of the first echo and the second echo.
Figure 4C:
FIG. 4C shows a processed MRA image without fat saturation using a dual-echo QISS FLASH sequence.

FIG. 4A shows an unprocessed MRA image without fat saturation using a dual-echo QISS FLASH sequence. Here, the first echo has a TE of 1.7 ms. The second echo may have a TE of 3.9 ms. FIG. 4B shows a mask image using the absolute difference of the first echo and the second echo. The absolute difference mask image shows high fat signal and moderate muscle signal, with negligible signal from blood vessels. FIG. 4C shows a processed MRA image without fat saturation using a dual-echo QISS FLASH sequence. The processed image may be obtained by subtracting a constant C1 times the mask image. The constant C1 may be selected based on previously collected data. For instance, the constant C1 may be selected between 2.0 and 5.0.

Figure 5A:
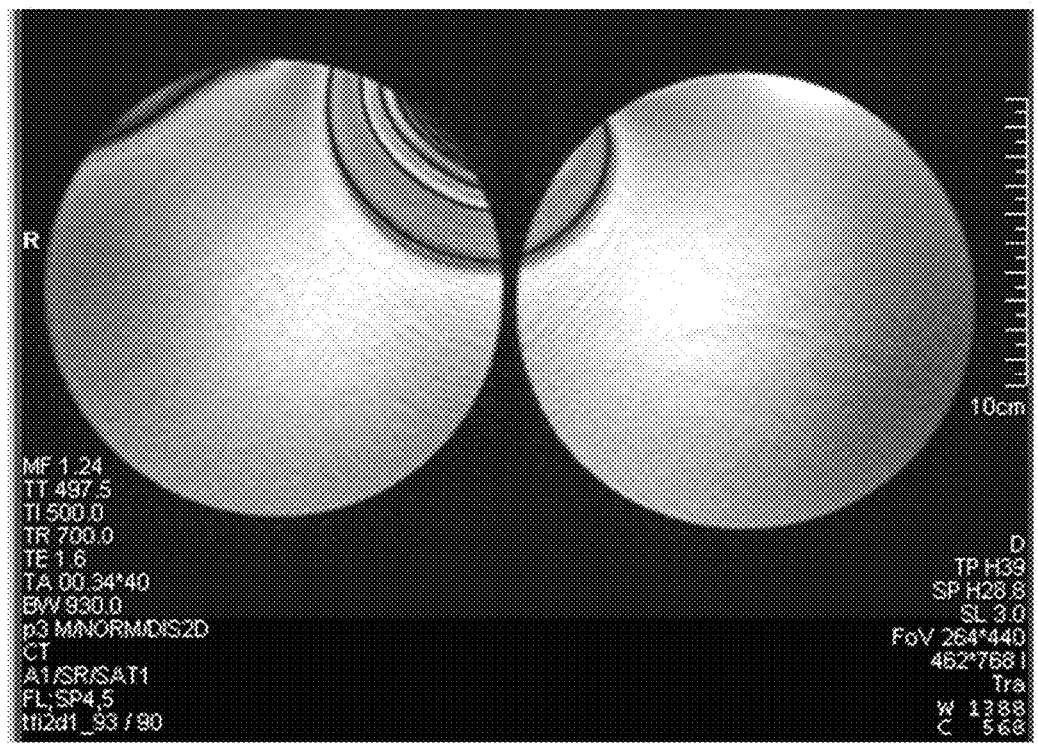
FIG. 5A shows an unprocessed phantom image with susceptibility artifact from metal using a one-shot QISS trueFISP sequence.

FIG. 5A shows an unprocessed phantom image with susceptibility artifact from metal using a one-shot QISS trueFISP sequence. Here, the metal artifact is very obvious. The echo time TE is at 1.6 ms with bandwidth of 930 Hz/px.

Figure 5B:
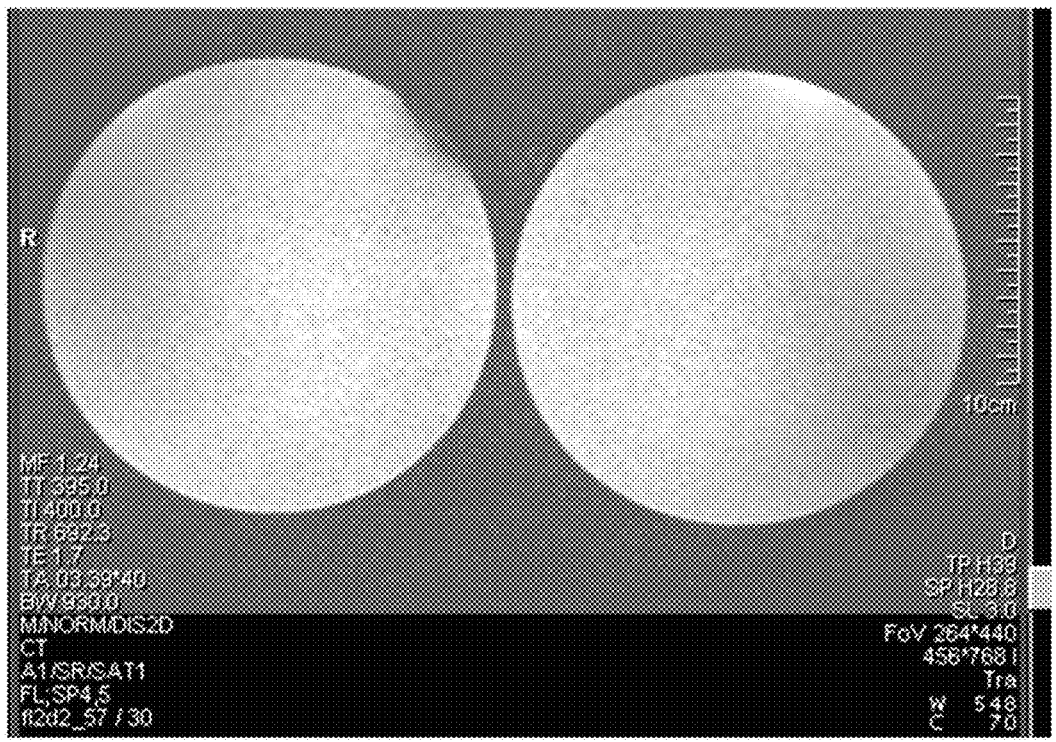
FIG. 5B shows a phantom image using a dual-echo QISS FLASH sequence with TE at 1.7 ms.

FIG. 5B shows a phantom image using a dual-echo QISS FLASH sequence with TE at 1.7 ms. The bandwidth is 930 Hz/px and the imaging data were collected using 4 shots. FIG. SC shows a phantom image using a dual-echo QISS FLASH sequence with TE at 3.9 ms. The bandwidth is 395 Hz/px and the imaging data were collected using 4 shots.

Figure 5C:
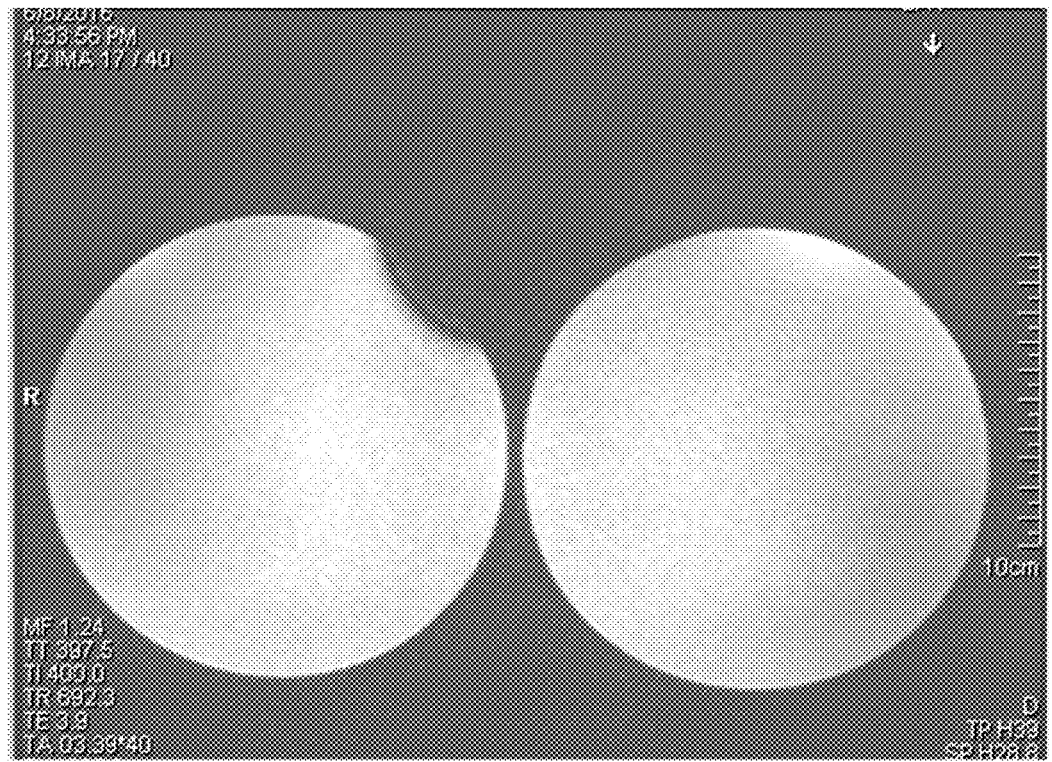
FIG. 5C shows a phantom image using a dual-echo QISS FLASH sequence with TE at 3.9 ms.
Figure 5D:
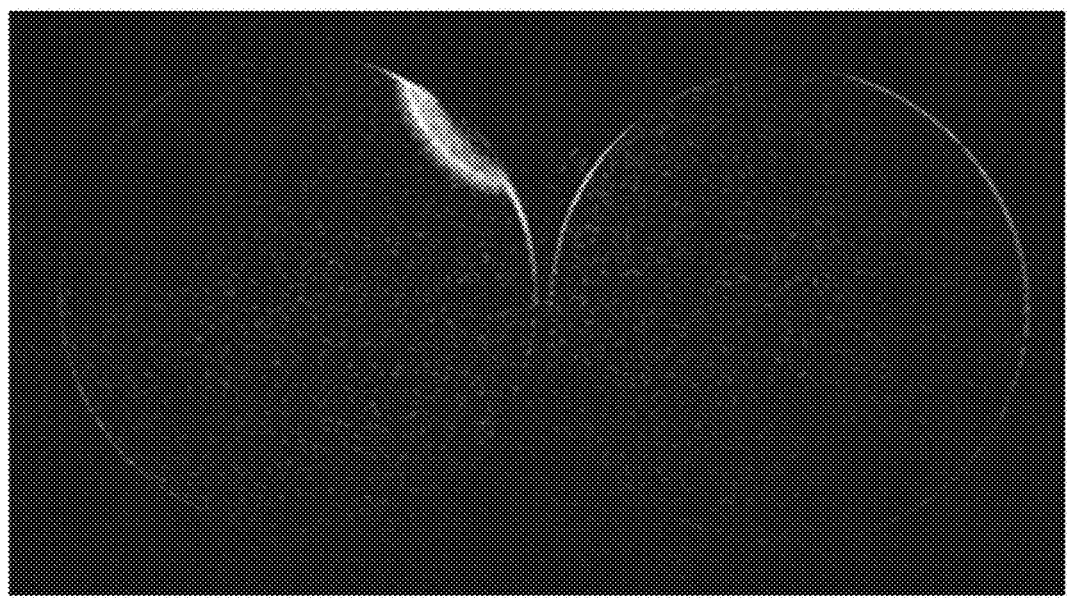
FIG. 5D shows a mask image using the absolute difference of the two images in FIGS. 5B and 5C.

FIG. 5D shows a mask image using the absolute difference of the two images in FIGS. 5B and 5C. The bright region clearly identifies the susceptibility artifact from metal.

In the examples described in the present disclosure, an MRI system implements a dual-echo, dual-bandwidth QISS FLASH pulse sequence, which allows for enhanced background suppression by processing each echo with an absolute difference mask image. The dual-echo QISS MRA overcomes limitations of the standard QISS sequence by allowing the acquisition of a background-suppressed short-TE, high bandwidth first echo image that is insensitive to susceptibility artifacts, simultaneously with a low-bandwidth, second echo image that provides competitive image quality to standard QISS. Unlike a dual-echo Dixon technique, the choice of TE is less restrictive when using the methods described in the present disclosure, and there are no fat-water phase swaps.

Further, by distinguishing regions of altered magnetic susceptibility, the mask image may have additional value for highlighting ferromagnetic clips or other metallic implants that might be inconspicuous in the QISS MRA. Given that the use of multiple shots increases scan time compared with standard single-shot QISS, the technique may be reserved for areas where there is concern for potential susceptibility artifacts using a bSSFP readout.

Figure 6:
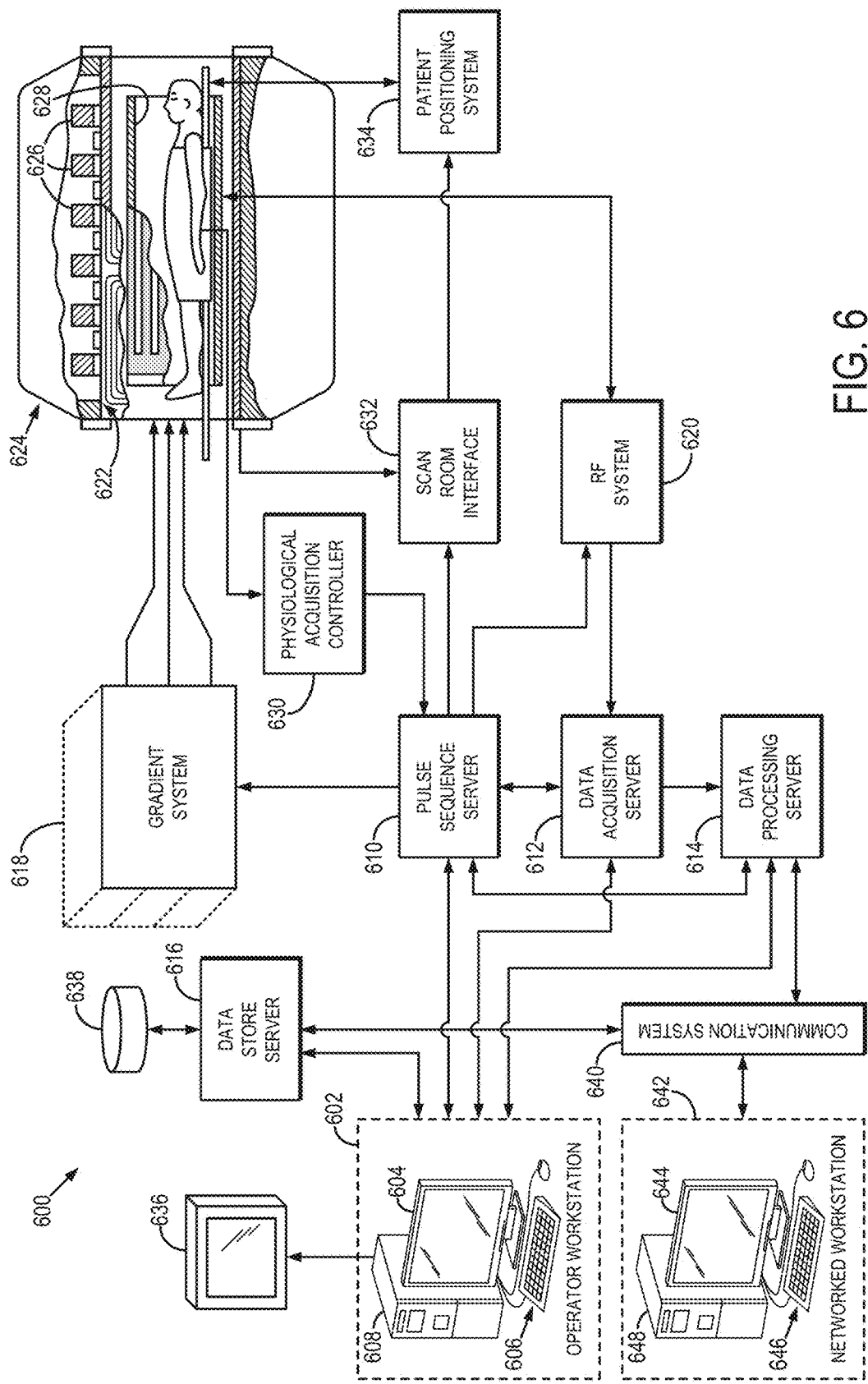
FIG. 6 is a block diagram of an example of an MRI system that can implement the methods described in the present disclosure.

Referring particularly now to FIG. 6, an example of an MRI system 600 that can implement the methods described here is illustrated. The MRI system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

The present disclosure has been described in terms of one or more preferred embodiments, and it should be appreciated that many equivalents, alternatives, variations, and modifications, aside from those expressly stated, are possible and within the scope of the disclosure.

The invention claimed is:

1. A method for generating a magnetic resonance angiogram, comprising:
 (a) acquiring, using a magnetic resonance imaging (MRI) system, first echo image data at a first echo time and second echo image data at a second echo time while applying a pulse sequence that forms echoes at least at the first echo time and the second echo time in a given repetition time period;
 (b) reconstructing, with a computer system, a first image from the first echo image data and a second image from the second echo image data;
 (c) generating, with the computer system, a mask image using the first image and the second image;
 (d) computing, with the computer system, a first scale factor by calculating a first ratio of a selected tissue signal in the first image and the mask image, and
 (e) generating, with the computer system, a first scaled mask image by multiplying the mask image by the first scale factor;
 (f) computing, with the computer system, a second scale factor by calculating a second ratio of the selected tissue signal in the second image and the mask image
 (g) generating, with the computer system, a second scaled mask image by multiplying the mask image by the second scale factor;
 (h) generating, with the computer system, a first processed image by subtracting the first scaled mask image from the first image;
 (i) generating, with the computer system, a second processed image by subtracting the second scaled mask image from the second echo image; and
 (j) generating, with the computer system, a projection angiogram from each of the first and second processed images.

2. The method as recited in claim 1, wherein the MRI system acquires the first and second echo image data using different readout bandwidths.

3. The method as recited in claim 1, wherein the MRI system acquires the first echo image data using a readout bandwidth greater than 400 Hz/pixel.

4. The method as recited in claim 3, wherein the first echo time is less than 2 milliseconds.

5. The method as recited in claim 1, wherein the MRI system synchronizes data acquisition to a diastolic phase of the cardiac cycle.

6. The method as recited in claim 1, wherein the pulse sequence further comprises applying flow compensation along at least one direction.

7. The method as recited in claim 1, wherein generating the mask image includes compute a difference between the first image and the second image.

8. The method as recited in claim 1, wherein the MRI system acquires additional echo image data, at least one additional image is reconstructed from the additional echo image data, and the mask image is generated based at least in part on a standard deviation calculated using the first image, the second image, and the at least one additional image.

9. The method as recited in claim 1, wherein the pulse sequence implemented by the MRI system uses one of a Cartesian, radial, and spiral k-space trajectory while acquiring the first and second echo image data.

10. The method as recited in claim 1, wherein the pulse sequence further comprises applying a multiband radio frequency (RF) excitation to excite more than one slice simultaneously.

11. The method as recited in claim 1, further comprising applying one or more acceleration techniques to acquire the first and second echo image data and to reconstruct the first and second images therefrom.

12. The method as recited in claim 1, further comprising calculating at least one of a T2* map and a magnetic susceptibility map using the first and second echo image data.

13. The method as recited in claim 1, wherein the selected tissue signal is a fat signal.

14. A magnetic resonance imaging (MRI) system comprising:
 a magnet system configured to generate a polarizing magnetic field about at least a region of interest (ROI) in a subject arranged in the MRI system;
 a plurality of gradient coils configured to apply a gradient field to the polarizing magnetic field;
 a radio frequency (RF) system configured to apply an excitation field to the subject and acquire echo image data from the ROI;
 a computer system programmed to:
  acquire first echo image data at a first echo time and second echo image data at a second echo time while controlling the RF system and the plurality of gradient coils to apply a pulse sequence that forms echoes at least at the first echo time and the second echo time;
  reconstruct a first image from the first echo image data and a second image from the second echo image data;
  generate a mask image using the first image and the second image;
  compute a first scale factor by calculating a first ratio of a selected tissue signal in the first image and the mask image
  generate a first scaled mask image by multiplying the mask image by the first scale factor;
  compute a second scale factor by calculating a second ratio of the selected tissue signal in the second image and the mask image
  generate a second scaled mask image by multiplying the mask image by the second scale factor;
  generate a first processed image by subtracting the first scaled mask image from the first image;
  generate a second processed image by subtracting the second scaled mask image from the second image; and
  generate a projection angiogram from each of the first and second processed images.

15. The MRI system of claim 14, wherein the MRI system acquires the first and second echo image data using different readout bandwidths.

16. The MRI system of claim 14, wherein the MRI system acquires the first echo image data using a readout bandwidth greater than 400 Hz/pixel.

17. The MRI system of claim 16, and wherein the first echo time is less than 2 milliseconds.

18. The MRI system of claim 14, wherein the MRI system synchronizes data acquisition to a diastolic phase of a cardiac cycle.

19. The MRI system of claim 14, wherein the selected tissue signal is a fat signal.

\* \* \* \* \*

UNITED STATES PATENT AND TRADEMARK OFFICE
CERTIFICATE OF CORRECTION

PATENT NO. : 10,401,458 B2  
APPLICATION NO. : 15/708824  
DATED : September 3, 2019  
INVENTOR(S) : Robert R. Edelman Page 1 of 1

It is certified that error appears in the above-identified patent and that said Letters Patent is hereby corrected as shown below:

In the Specification

Column 6, Line 22, "FIG. SC" should be --FIG. 5C--.

Signed and Sealed this  
Fifteenth Day of October, 2019

Andrei Iancu  
*Director of the United States Patent and Trademark Office*